(12) United States Patent
Sekiya (10) Patent No.: US 10,971,350 B2
(45) Date of Patent: Apr. 6, 2021

(54) WAFER HOLDING APPARATUS AND WAFER PROCESSING METHOD USING THE SAME

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 42 days.

(21) Appl. No.: 16/595,776

(22) Filed: Oct. 8, 2019

(65) Prior Publication Data

US 2020/0118863 A1 Apr. 16, 2020

(30) Foreign Application Priority Data

Oct. 16, 2018 (JP) .............................. JP2018-195118

(51) Int. Cl.
| | | |
|---|---|---|
| *H01L 21/02* | (2006.01) | |
| *H01L 21/683* | (2006.01) | |
| *H01L 41/09* | (2006.01) | |
| *H01L 21/66* | (2006.01) | |

(52) U.S. Cl.
CPC .... *H01L 21/02013* (2013.01); *H01L 21/6838* (2013.01); *H01L 22/12* (2013.01); *H01L 41/0906* (2013.01)

(58) Field of Classification Search
CPC ......... H01L 21/02013; H01L 21/02016; H01L 21/6838; H01L 22/12; H01L 41/0906; B24B 7/228; B28D 5/0094; B25B 11/005
See application file for complete search history.

(56) References Cited

U.S. PATENT DOCUMENTS

| | | | | |
|---|---|---|---|---|
| 1,121,452 | A * | 12/1914 | Bagnall ................... | B24B 37/30 451/388 |
| 3,809,050 | A * | 5/1974 | Chough ............... | B28D 5/0094 125/35 |
| 4,213,698 | A * | 7/1980 | Firtion ..................... | B28D 5/00 355/77 |
| 6,688,300 | B2 * | 2/2004 | Tieber .................. | B28D 5/0094 125/35 |
| 6,805,338 | B1 * | 10/2004 | Okuda ................ | H01L 21/6838 269/21 |
| 7,425,238 | B2 * | 9/2008 | Muto .................... | B25B 11/005 118/500 |

(Continued)

FOREIGN PATENT DOCUMENTS

JP 2010155298 A 7/2010

*Primary Examiner* — Scott B Geyer
(74) *Attorney, Agent, or Firm* — Greer Burns & Crain Ltd.

(57) ABSTRACT

A wafer holding apparatus for holding a wafer having undulation. The wafer holding apparatus includes a holding portion having a holding surface for holding the wafer, the holding portion being composed of a plurality of piezoelectric elements having suction holes selectively connected to a vacuum source, the piezoelectric elements having front end surfaces collected to form the holding surface. The wafer holding apparatus further includes a frame member supporting the holding portion and a control unit controlling a voltage to be applied to each of the piezoelectric elements according to the undulation of the wafer, whereby the wafer is held on the holding surface in the condition where the undulation of the wafer is followed by undulation produced on the holding surface due to a change in a length of each of the piezoelectric elements.

2 Claims, 11 Drawing Sheets

(56) References Cited

U.S. PATENT DOCUMENTS

| | | | | |
|---|---|---|---|---|
| 2004/0080734 | A1* | 4/2004 | Taniguchi | G03F 7/70783 355/53 |
| 2007/0200377 | A1* | 8/2007 | Nishio | B25J 15/0616 294/188 |
| 2010/0144147 | A1* | 6/2010 | Muneishi | H01L 21/6838 438/689 |
| 2010/0195080 | A1* | 8/2010 | Compen | G03F 7/707 355/72 |
| 2011/0207241 | A1* | 8/2011 | Tomisaka | H01L 22/20 438/5 |
| 2012/0139192 | A1* | 6/2012 | Ooi | B25B 11/005 279/3 |
| 2013/0147129 | A1* | 6/2013 | Chiu | H01L 21/6831 279/3 |
| 2013/0330165 | A1* | 12/2013 | Wimplinger | H01L 21/68 414/800 |
| 2014/0295645 | A1* | 10/2014 | Kurokawa | B24B 7/228 438/464 |
| 2015/0303049 | A1* | 10/2015 | Tanaka | B24B 7/228 451/41 |
| 2018/0297168 | A1* | 10/2018 | Tanaka | H01L 21/304 |
| 2020/0381243 | A1* | 12/2020 | Tanaka | H01L 21/02013 |

* cited by examiner

WAFER HOLDING APPARATUS AND WAFER PROCESSING METHOD USING THE SAME

BACKGROUND OF THE INVENTION

Field of the Invention

The present invention relates to a wafer holding apparatus for holding a wafer having undulation and also to a wafer processing method using the wafer holding apparatus.

Description of the Related Art

A functional layer is formed on the upper surface of a substrate, and a plurality of devices such as integrated circuits (ICs) and large scale integrations (LSIs) are formed in the functional layer to thereby obtain a wafer having the devices on the front side. The wafer is divided into individual device chips by using a dicing apparatus or a laser processing apparatus. The device chips thus obtained are used in various electrical equipment such as mobile phones and personal computers.

The substrate as an initial wafer is produced by slicing an ingot of silicon, for example, with a wire saw. Thereafter, both sides of the initial wafer are ground to become flat surfaces. Further, the initial wafer has undulation (warpage). An invention related to a method for effectively removing the undulation of the initial wafer was patented to the present assignee in Japan (see Japanese Patent No. 5324212).

SUMMARY OF THE INVENTION

However, the above method has the following problem. In a step of applying a gel resin to the wafer so that the undulation of the wafer is followed by the gel resin and next curing the gel resin, internal stress may be generated in the wafer. Accordingly, the undulation of the wafer is slightly distorted, so that the undulation of the wafer cannot be properly removed in a subsequent grinding step of grinding the wafer.

It is therefore an object of the present invention to provide a wafer holding apparatus which allows proper removal of the undulation of a wafer in a grinding step of grinding the wafer.

It is another object of the present invention to provide a wafer processing method using the wafer holding apparatus mentioned above.

In accordance with an aspect of the present invention, there is provided a wafer holding apparatus for holding a wafer having undulation, the wafer holding apparatus including: a holding portion having a holding surface for holding the wafer, the holding portion being composed of a plurality of length changing elements having suction holes selectively connected to a vacuum source, the length changing elements having front end surfaces collected to form the holding surface; a frame member supporting the holding portion; and a control unit controlling a length of each of the length changing elements according to the undulation of the wafer, wherein the length of each of the length changing elements is controlled by the control unit according to the undulation of the wafer, so that the wafer is held on the holding surface in the condition where the undulation of the wafer is followed by undulation produced on the holding surface due to a change in the length of each of the length changing elements.

Preferably, the plurality of length changing elements include: a plurality of piezoelectric elements having front end surfaces; and the control unit controlling a voltage to be applied to each of the piezoelectric elements, whereby the voltage to be applied to each of the piezoelectric elements is controlled by the control unit according to the undulation of the wafer, so that the undulation of the wafer is followed by the undulation produced on the holding surface formed by collecting the front end surfaces of the piezoelectric elements.

In accordance with another aspect of the present invention, there is provided a wafer processing method for processing a wafer having a first surface and a second surface opposite to the first surface, the wafer processing method using a wafer holding apparatus including a holding portion having a holding surface for holding the wafer having undulation, the holding portion being composed of a plurality of length changing elements having suction holes selectively connected to a vacuum source, the length changing elements having front end surfaces collected to form the holding surface, a frame member supporting the holding portion, and a control unit controlling a length of each of the length changing elements according to the undulation of the wafer, the wafer processing method including: an undulation detecting step of detecting undulation of the first surface of the wafer; an undulation producing step of controlling the length of each of the length changing elements of the wafer holding apparatus according to the undulation of the wafer, thereby producing undulation on the holding surface; a holding step of holding the wafer on the holding surface in the condition where the undulation of the wafer is made to coincide with the undulation of the holding surface; a resin applying step of applying a gel resin to a substrate having a flat surface; a resin curing step of opposing the second surface of the wafer to the flat surface of the substrate, next pressing the gel resin applied to the flat surface of the substrate, next transferring the gel resin to the second surface of the wafer, and finally curing the gel resin to thereby form a resin layer on the second surface of the wafer; and a separating step of separating the wafer with the resin layer from the substrate.

Preferably, the wafer processing method further includes: a second surface supporting step of supporting the second surface of the wafer with the resin layer on a chuck table; a first surface flattening step of grinding the first surface of the wafer supported on the chuck table by using a grinding wheel, thereby flattening the first surface of the wafer; a resin layer peeling step of peeling the resin layer from the wafer after performing the first surface flattening step; a first surface supporting step of supporting the first surface of the wafer on the chuck table after performing the resin layer peeling step; and a second surface flattening step of grinding the second surface of the wafer supported on the chuck table by using the grinding wheel, thereby flattening the second surface of the wafer.

The wafer holding apparatus of the present invention is configured so as to hold the wafer in the condition where the undulation of the wafer is followed by the undulation of the holding surface. In the step of applying a gel resin to the wafer so that the undulation of the wafer is followed by the gel resin and next curing the gel resin, internal stress may be generated in the wafer. However, the undulation of the wafer can be maintained by the holding portion, so that even when the gel resin is cured, the wafer is not distorted. Accordingly, by using the wafer holding apparatus of the present invention, the undulation of the wafer can be properly removed by grinding the wafer after curing the gel resin.

According to the wafer processing method of the present invention, the following effect can be exhibited. In the resin curing step of applying a gel resin to the wafer so that the undulation of the wafer is followed by the gel resin and next curing the gel resin, internal stress may be generated in the wafer. However, the undulation of the wafer can be maintained by the holding portion, so that the even when the gel resin is cured, the wafer is not distorted. Accordingly, by performing the wafer processing method of the present invention, the undulation of the wafer can be properly removed by grinding the wafer after curing the gel resin.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
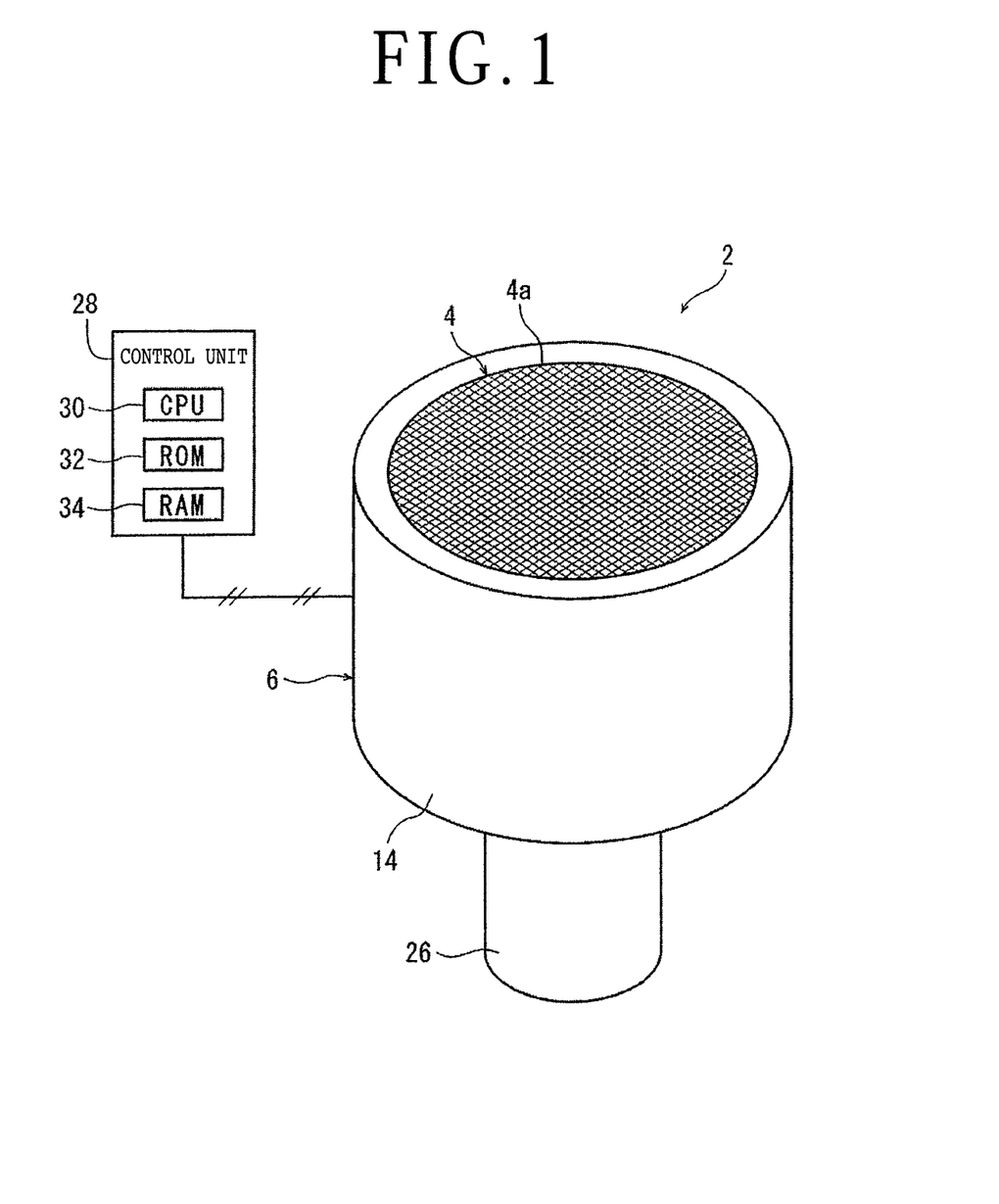
FIG. 1 is a perspective view of a wafer holding apparatus according to a preferred embodiment of the present invention.

There will now be described a wafer holding apparatus and a wafer processing method using the wafer holding apparatus according to a preferred embodiment of the present invention with reference to the drawings. First, a wafer holding apparatus 2 according to this preferred embodiment will be described with reference to FIGS. 1 and 2. FIG. 1 is a perspective view of the wafer holding apparatus 2. As depicted in FIG. 1, the wafer holding apparatus 2 includes a holding portion 4 having a holding surface 4a for holding a wafer having undulation and a frame member 6 for supporting the holding portion 4.

Figure 2:
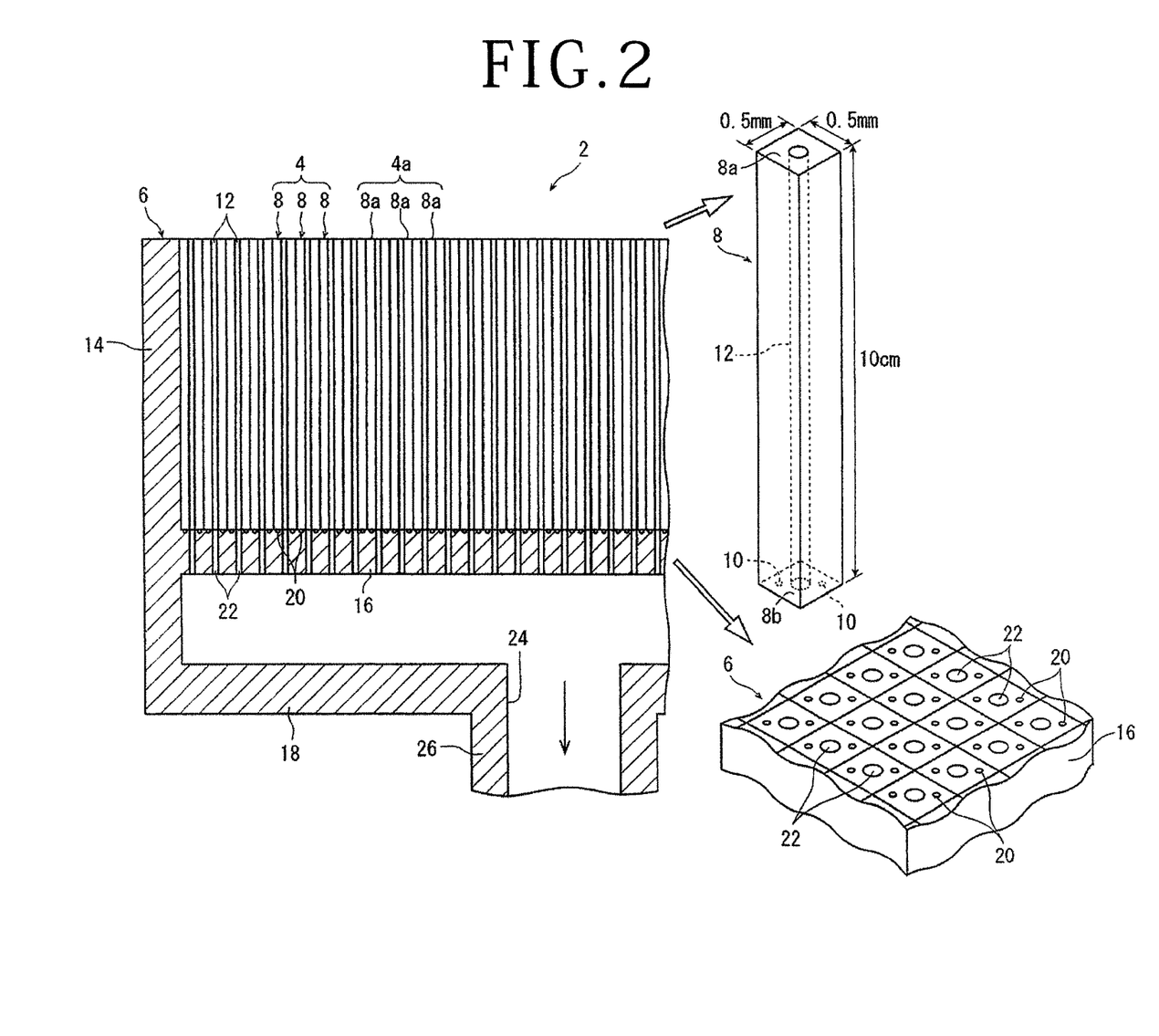
FIG. 2 is an enlarged sectional view of an essential part of the wafer holding apparatus depicted in FIG. 1.

The holding portion 4 is composed of a plurality of length changing elements. As depicted in FIG. 2, each of the length changing elements is formed from a piezoelectric element 8 having a prismatic shape. Each piezoelectric element 8 has a front end surface (upper end surface as viewed in FIG. 2) 8a and a base end surface (lower end surface as viewed in FIG. 2) 8b. The front end surface 8a of each piezoelectric element 8 is displaced in the longitudinal direction of each piezoelectric element 8 according to a voltage applied thereto. A pair of terminals 10 are provided on the base end surface 8b of each piezoelectric element 8. Each piezoelectric element 8 has a suction hole 12 extending in the longitudinal direction from the front end surface 8a to the base end surface 8b. As depicted in FIG. 1, the holding surface 4a of the holding portion 4 has a circular shape, and the holding surface 4a is formed by collecting the front end surfaces 8a of the plural piezoelectric elements 8. As depicted in FIG. 2, the front end surface 8a and the base end surface 8b of each piezoelectric element 8 may have the same size of approximately 0.5 mm×0.5 mm, for example, and each piezoelectric element 8 may have a length of approximately 10 cm.

As depicted in FIG. 2, the frame member 6 has a cylindrical wall 14, a circular inside wall 16 formed inside the cylindrical wall 14, and a circular end wall 18 formed at one end (lower end as viewed in FIG. 2) of the cylindrical wall 14. Accordingly, a space is defined between the cylindrical wall 14 and the inside wall 16, and the plural piezoelectric elements 8 are stored in this space. As depicted in FIG. 2, the inside wall 16 is provided with a plurality of electrodes 20 respectively connected to the terminals 10 of the plural piezoelectric elements 8 and a plurality of through holes 22 respectively communicating with the suction holes 12 of the plural piezoelectric elements 8. The end wall 18 has a central circular opening 24, and a cylindrical connecting portion 26 projects outward from the end wall 18 at the peripheral edge of the circular opening 24.

The suction holes 12 of the plural piezoelectric elements 8 constituting the holding portion 4 are selectively connected through the through holes 22 of the inside wall 16, the connecting portion 26, and a suitable passage (not depicted) to a vacuum source (not depicted). Accordingly, by operating the vacuum source, a suction force is produced on the holding surface 4a of the holding portion 4, thereby holding the wafer on the holding surface 4a under suction.

Figure 3:
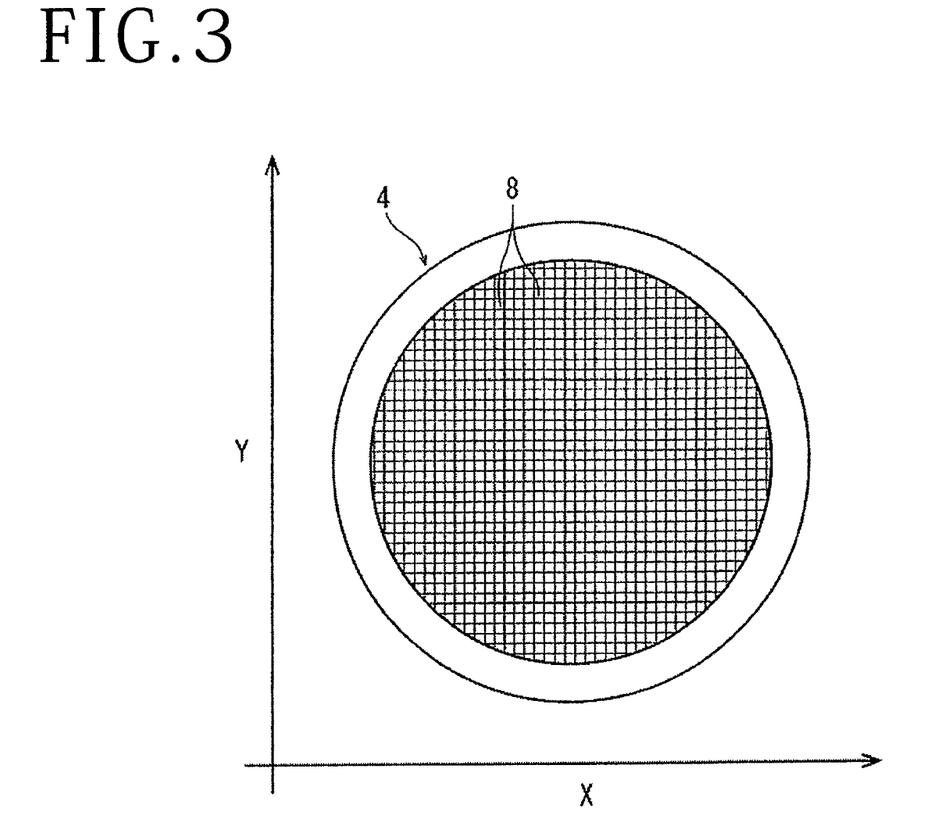
FIG. 3 is a graph depicting X and Y coordinates (position data) of each piezoelectric element as stored in a random access memory included in a control unit depicted in FIG. 1.

As depicted in FIG. 1, the wafer holding apparatus 2 further includes a control unit 28 for controlling the length changing elements (the piezoelectric elements 8 in this preferred embodiment) according to the undulation of the wafer. The control unit 28 is configured by a computer, and it includes a central processing unit (CPU) 30 for computing according to a control program, a read only memory (ROM) 32 previously storing the control program or the like, and a random access memory (RAM) 34 for storing computation results or the like. The random access memory 34 also previously stores X and Y coordinates (position data) of each piezoelectric element 8 as depicted in FIG. 3. Further, wafer undulation data detected by an undulation detecting apparatus 38 to be hereinafter described is stored into the random access memory 34, and a voltage to be applied to each piezoelectric element 8 is controlled by the control unit 28 according to the wafer undulation data stored in the random access memory 34, thereby adjusting the length of each piezoelectric element 8. Accordingly, undulation corresponding to the wafer undulation can be produced on the holding surface 4a. After producing the undulation corresponding to the wafer undulation on the holding surface 4a, the wafer is held on the holding surface 4a under suction, so that the holding surface 4a can hold the wafer so as to follow the undulation of the wafer.

Figure 4:
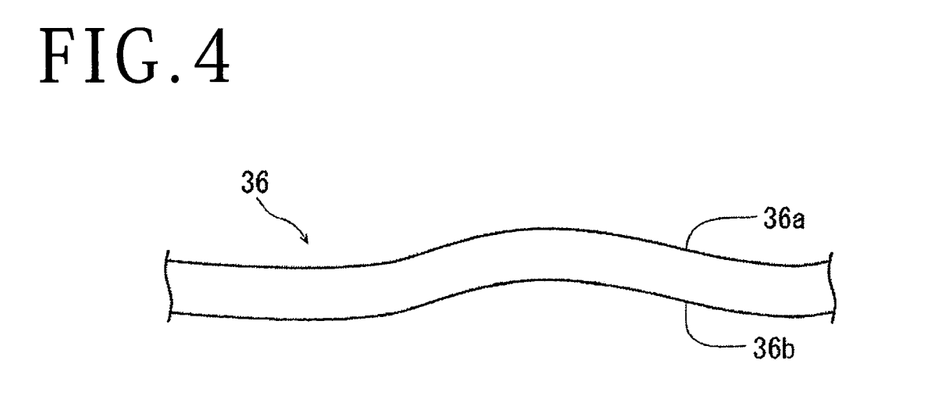
FIG. 4 is an enlarged sectional view of a wafer having undulation.
Figure 5:
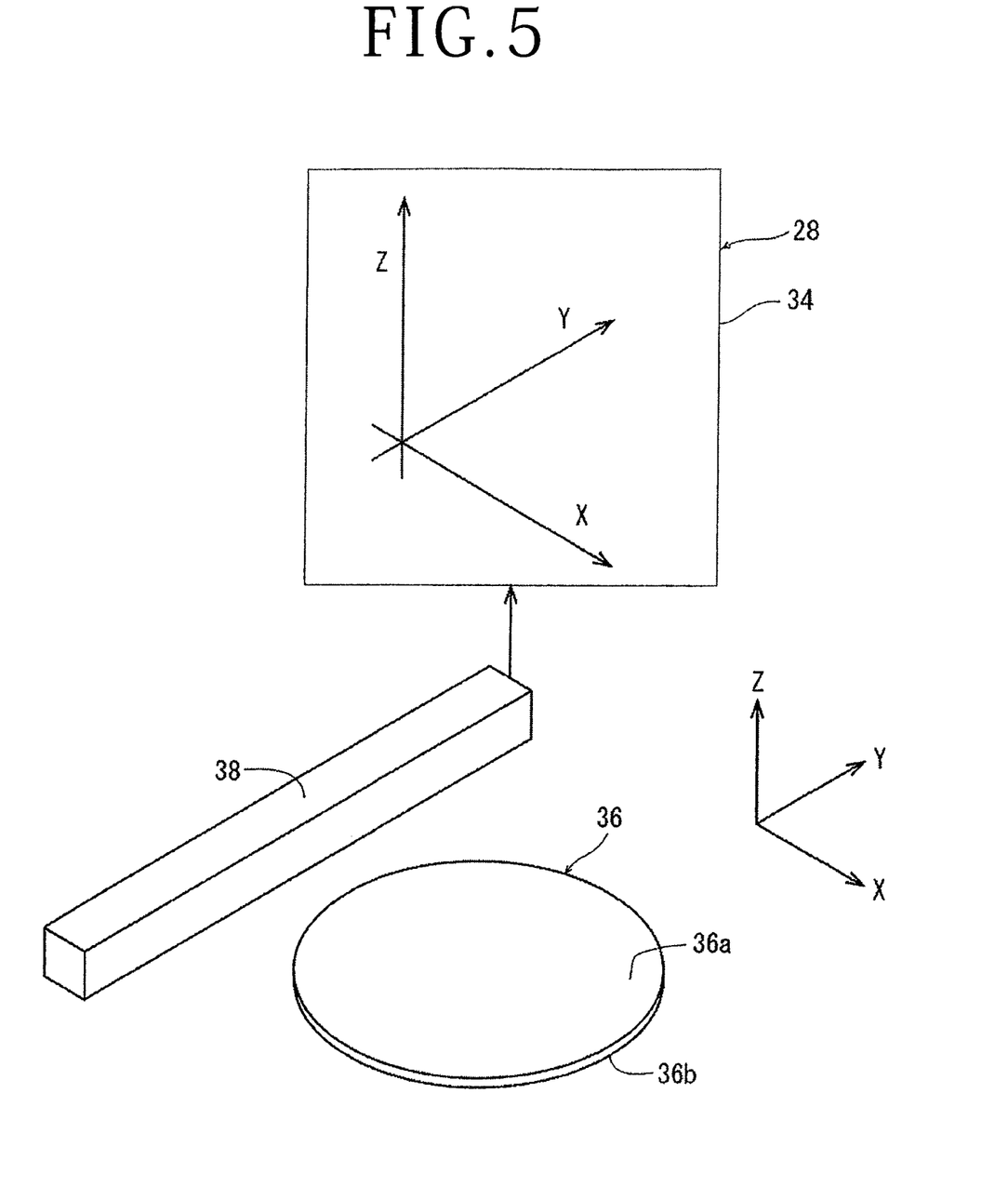
FIG. 5 is a perspective view depicting an undulation detecting step.

There will now be described a wafer processing method using the wafer holding apparatus 2 with reference to FIGS. 4 to 12. FIG. 4 is a sectional view depicting a part of a disk-shaped wafer 36 to be processed by the wafer processing method. FIG. 5 is a perspective view of the wafer 36. The wafer 36 is an initial wafer (as-cut wafer) having a predetermined thickness obtained by slicing a solid cylindrical ingot of silicon, for example, with a wire saw. The wafer 36 has undulation (warpage) due to resistance or the like in slicing the ingot. In FIG. 4, the undulation of the wafer 36 is depicted so as to be exaggerated for convenience of illustration. The wafer 36 has a first surface 36a and a second surface 36b opposite to the first surface 36a. As described later, the first surface 36a and the second surface 36b of the wafer 36 are ground to become flat surfaces. Thereafter, a functional layer is formed on the first surface 36a or the second surface 36b, and a plurality of devices such as ICs and LSIs are formed in the functional layer.

In the preferred embodiment, an undulation detecting step is performed to detect the undulation of the first surface 36a of the wafer 36. The undulation detecting step may be performed by using an undulation detecting apparatus 38, a part of which is depicted in FIG. 5. The undulation detecting apparatus 38 may be configured by an optical height detecting apparatus, for example. In the undulation detecting step, the longitudinal direction of the undulation detecting apparatus 38 is made parallel to the Y direction depicted by an arrow Y in FIG. 5, and the undulation detecting apparatus 38 and the wafer 36 are relatively moved in the X direction depicted by an arrow X in FIG. 5, in which the X direction is perpendicular to the Y direction. The first surface 36a of the wafer 36 is divided in the X direction and the Y direction to define a plurality of minute areas each having a suitable size (e.g., approximately 0.5 mm×0.5 mm) and the Z position of each minute area in the Z direction depicted by an arrow Z in FIG. 5 is measured in connection with the X and Y coordinates of each minute area, thereby detecting the undulation of the first surface 36a of the wafer 36. Thereafter, data on the undulation of the first surface 36a of the wafer 36 as detected by the undulation detecting apparatus 38 is stored into the random access memory 34 of the control unit 28. As described above, the X direction and the Y direction are perpendicular to each other in an XY plane, and the Z direction is perpendicular to both the X direction and the Y direction. The XY plane defined by the X direction and the Y direction is a substantially horizontal plane.

Figure 6:
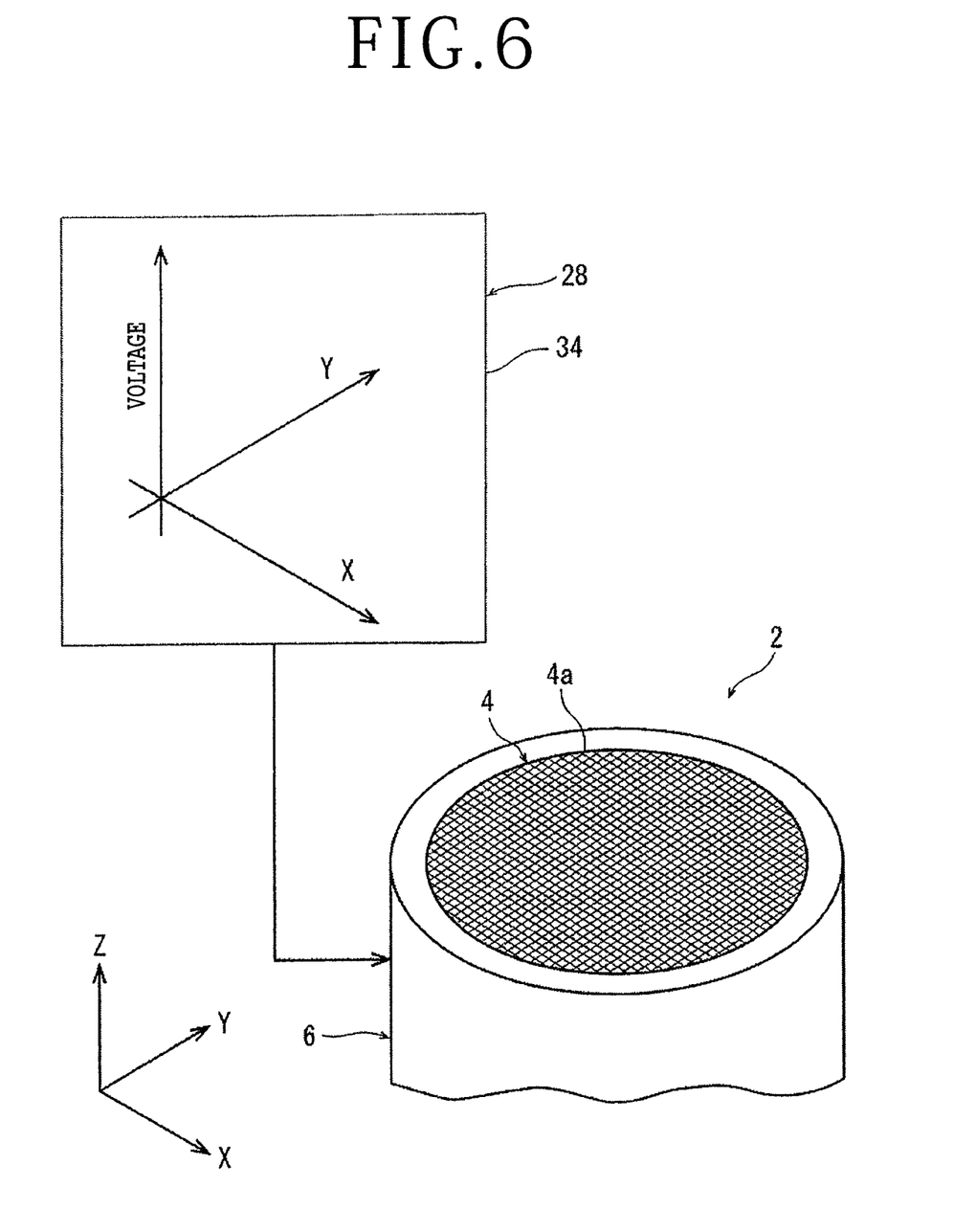
FIG. 6 is a perspective view depicting an undulation producing step.

After performing the undulation detecting step, an undulation producing step is performed to produce undulation on the holding surface 4a by controlling the length of each of the length changing elements of the wafer holding apparatus 2 according to the undulation of the wafer 36. Referring to FIG. 6, the Z positions of the undulation data stored in the random access memory 34 are first converted into voltage values in the control unit 28 in the undulation producing step. Thereafter, according to the undulation data converted into the voltage values, a voltage to be applied to each piezoelectric element 8 corresponding to each minute area of the wafer 36 is controlled by the control unit 28 in connection with the X and Y coordinates of each minute area, thereby adjusting the length of each piezoelectric element 8. Accordingly, undulation corresponding to the undulation of the first surface 36a of the wafer 36 can be produced on the holding surface 4a.

Figure 7:
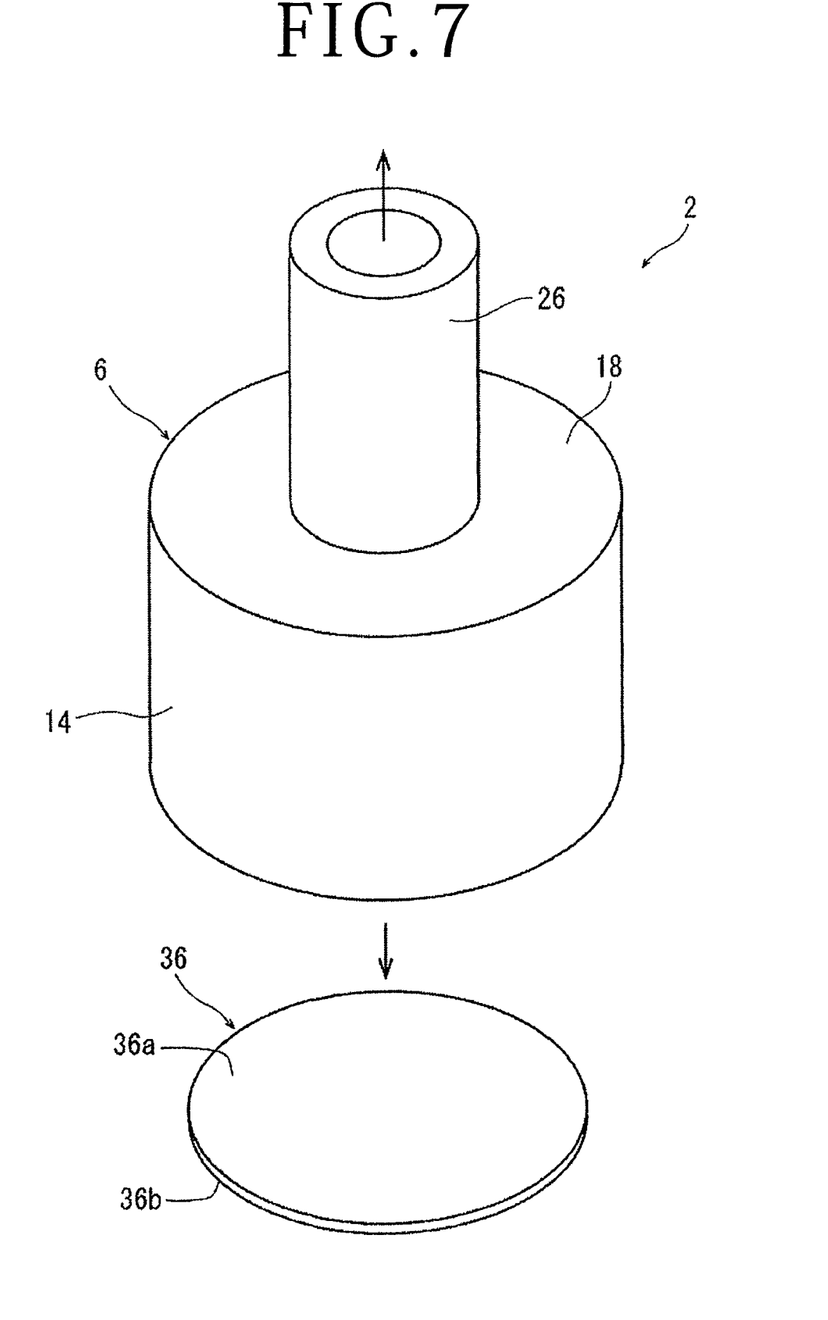
FIG. 7 is a perspective view depicting a holding step.

After performing the undulation producing step, a holding step is performed to hold the wafer 36 on the holding surface 4a in the condition where the undulation of the wafer 36 is made to coincide with the undulation of the holding surface 4a. Referring to FIG. 7, in the holding step, the undulation of the first surface 36a of the wafer 36 is first made to coincide with the undulation of the holding surface 4a produced in the undulation producing step. Thereafter, the first surface 36a of the wafer 36 is brought into contact with the holding surface 4a. Thereafter, the vacuum source connected to the holding portion 4 is operated to produce a suction force on the holding surface 4a, thereby holding the wafer 36 on the holding surface 4a under suction in the condition where the undulation of the wafer 36 is followed by the undulation of the holding surface 4a.

Figure 8:
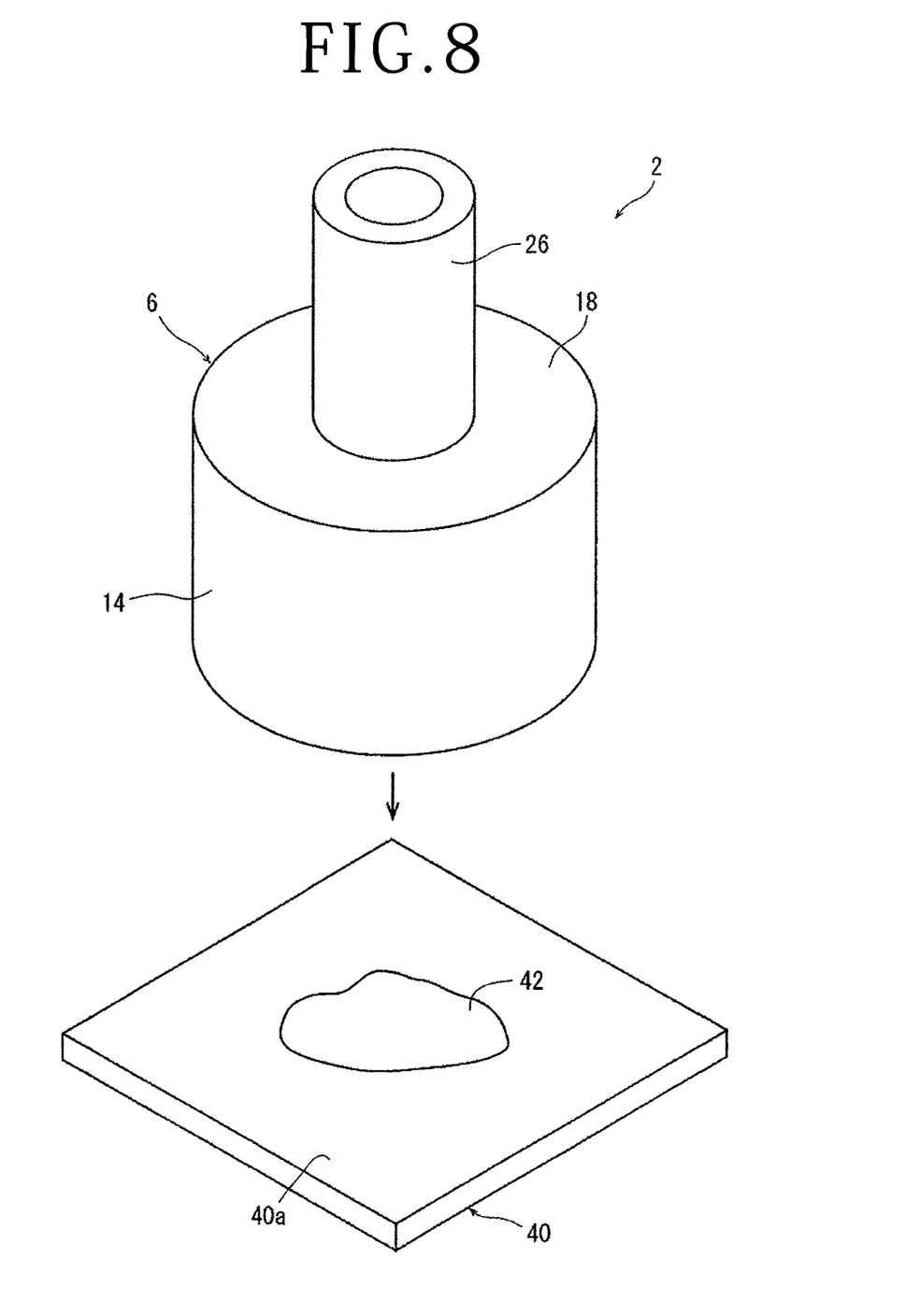
FIG. 8 is a perspective view depicting a resin applying step.

After performing the holding step, a resin applying step is performed to apply a gel resin 42 to a substrate 40 having a flat surface 40a as depicted in FIG. 8. More specifically, the gel resin 42 is applied to the flat surface 40a of the substrate 40 as depicted in FIG. 8. The gel resin 42 usable in the resin applying step may be selected from an ultraviolet curable resin curable by applying ultraviolet radiation, a thermosetting resin curable by applying heat, and a thermoplastic resin capable of becoming liquid by heating and capable of being cured by cooling. In the case of using an ultraviolet curable resin as the gel resin 42, the substrate 40 is formed of a material capable of transmitting ultraviolet radiation, such as glass.

Figure 9:
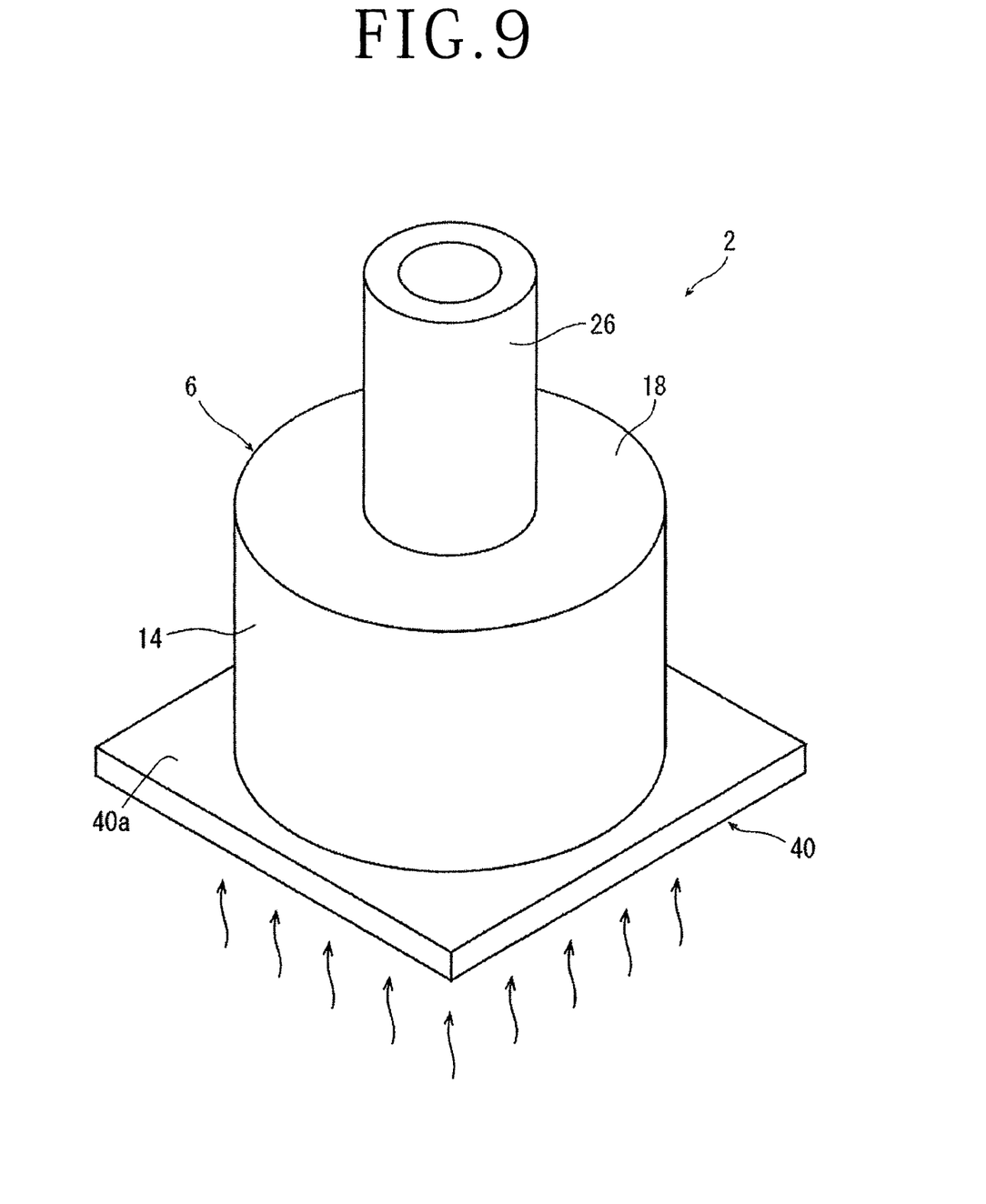
FIG. 9 is a perspective view depicting a resin curing step.
Figure 10:
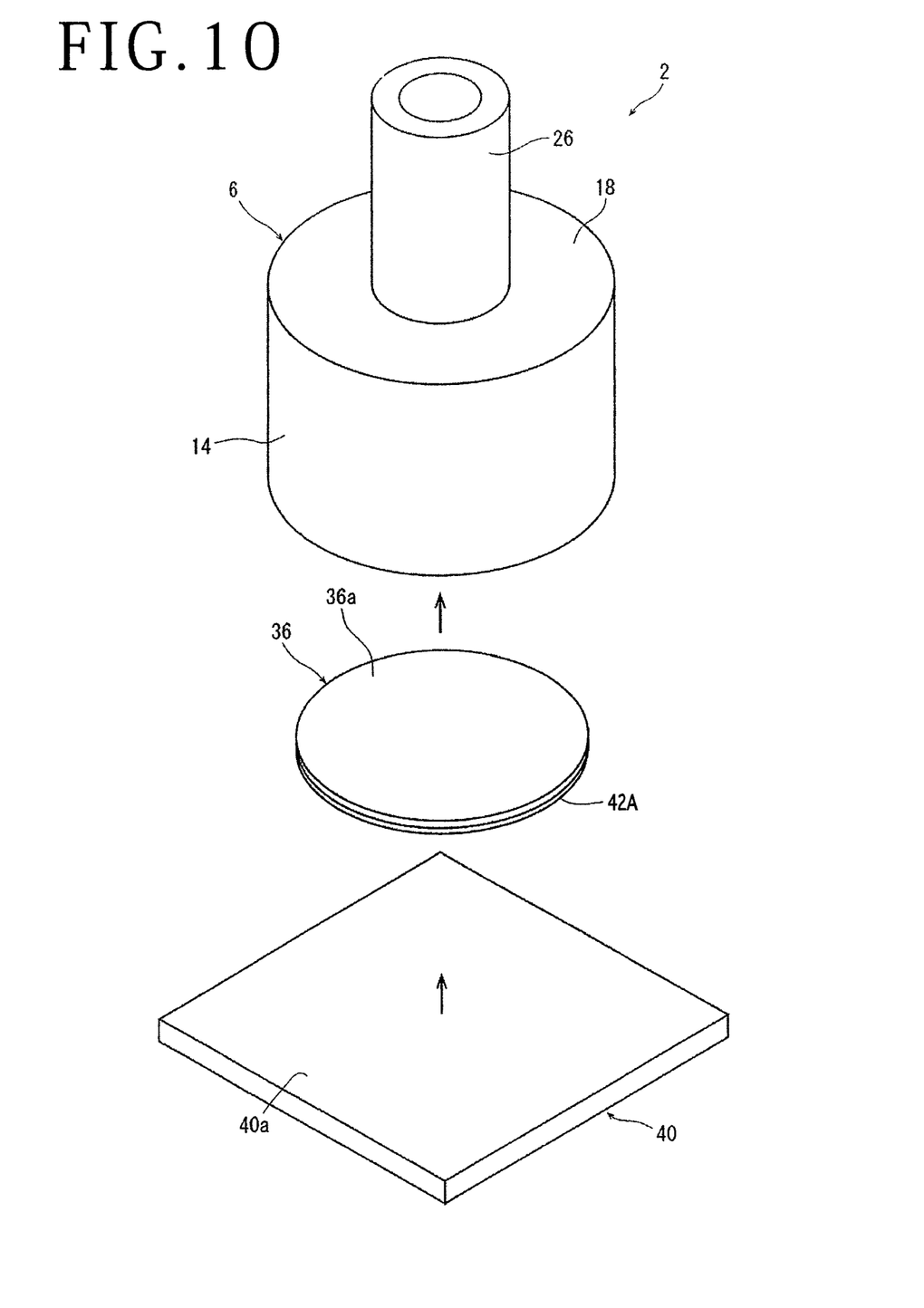
FIG. 10 is a perspective view depicting a separating step.

After performing the resin applying step, a resin curing step is performed to oppose the second surface 36b of the wafer 36 to the flat surface 40a of the substrate 40, next press the gel resin 42 applied to the flat surface 40a, next transfer the gel resin 42 to the second surface 36b of the wafer 36, and finally cure the gel resin 42 to thereby form a resin layer 42A (see FIG. 10). Referring to FIG. 9, in the resin curing step, the gel resin 42 applied to the flat surface 40a of the substrate 40 is pressed by the second surface 36b of the wafer 36 held under suction on the holding surface 4a of the holding portion 4. Accordingly, the gel resin 42 is spread on the whole of the flat surface 40a of the substrate 40, and the gel resin 42 is next transferred to the second surface 36b of the wafer 36 so as to follow the undulation of the second surface 36b. Thereafter, the gel resin 42 is cured by using suitable curing means (e.g., ultraviolet radiation applying means, heating means, or cooling means) according to the properties of the gel resin 42. At this time, the wafer 36 is held on the holding surface 4a of the holding portion 4 in the condition where the undulation of the wafer 36 is followed by the undulation of the holding surface 4a. Accordingly, the undulation of the wafer 36 can be maintained by the holding portion 4, so that when the gel resin 42 is cured, the wafer 36 is not distorted.

After performing the resin curing step, a separating step is performed to separate the wafer 36 with the resin layer 42A from the substrate 40 as depicted in FIG. 10. That is, in the separating step, the wafer 36 with the resin layer 42A is separated from the flat surface 40a of the substrate 40 in the condition where the resin layer 42A obtained by curing the gel resin 42 is formed on the second surface 36b of the wafer 36. Thereafter, the operation of the vacuum source connected to the holding portion 4 is stopped to remove the suction force applied to the holding surface 4a, thereby separating the wafer 36 with the resin layer 42A from the wafer holding apparatus 2 as depicted in FIG. 10.

Figure 11:
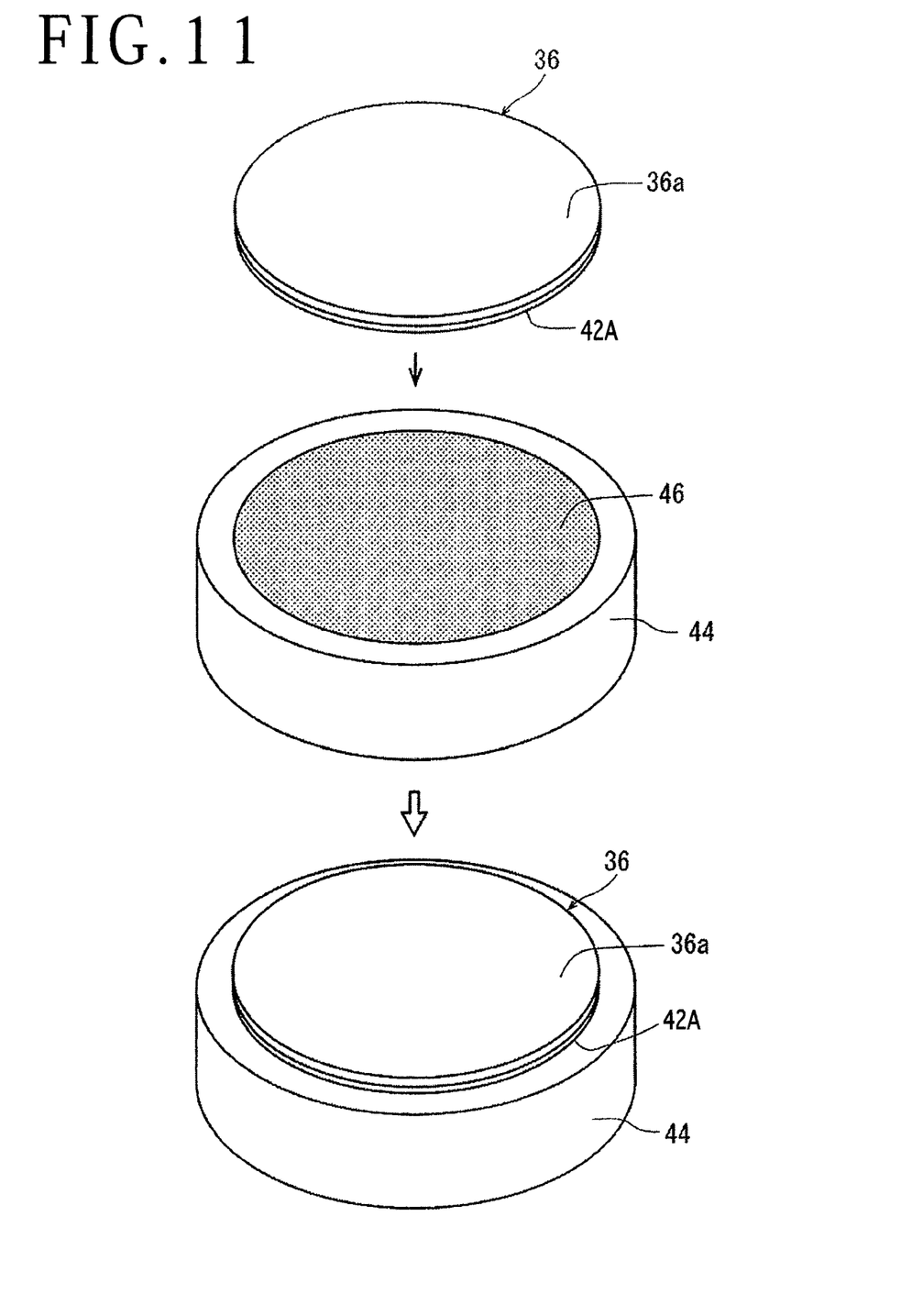
FIG. 11 is a perspective view depicting a second surface supporting step.

After performing the separating step, a second surface supporting step is performed to support the second surface 36b of the wafer 36 with the resin layer 42A on a chuck table. As depicted in FIG. 11, a chuck table 44 may be used in the second surface supporting step. The chuck table 44 has an upper surface provided with a vacuum chuck 46 having a porous structure. The vacuum chuck 46 is connected to suction means (not depicted) producing a vacuum. The chuck table 44 is rotatable about its vertical axis and also movable between a standby position where a workpiece is loaded or unloaded and a grinding position below a grinding apparatus 48 to be hereinafter described.

Referring to FIG. 11, in the second surface supporting step, the wafer 36 with the resin layer 42A is first placed on the upper surface of the vacuum chuck 46 in the condition where the first surface 36a of the wafer 36 is oriented upward. Thereafter, the suction means connected to the vacuum chuck 46 is operated to produce a suction force on the upper surface of the vacuum chuck 46, thereby holding the wafer 36 through the resin layer 42A on the chuck table 44 under suction. That is, the second surface 36b of the wafer 36 is supported through the resin layer 42A on the chuck table 44 as depicted in FIG. 11.

Figure 12:
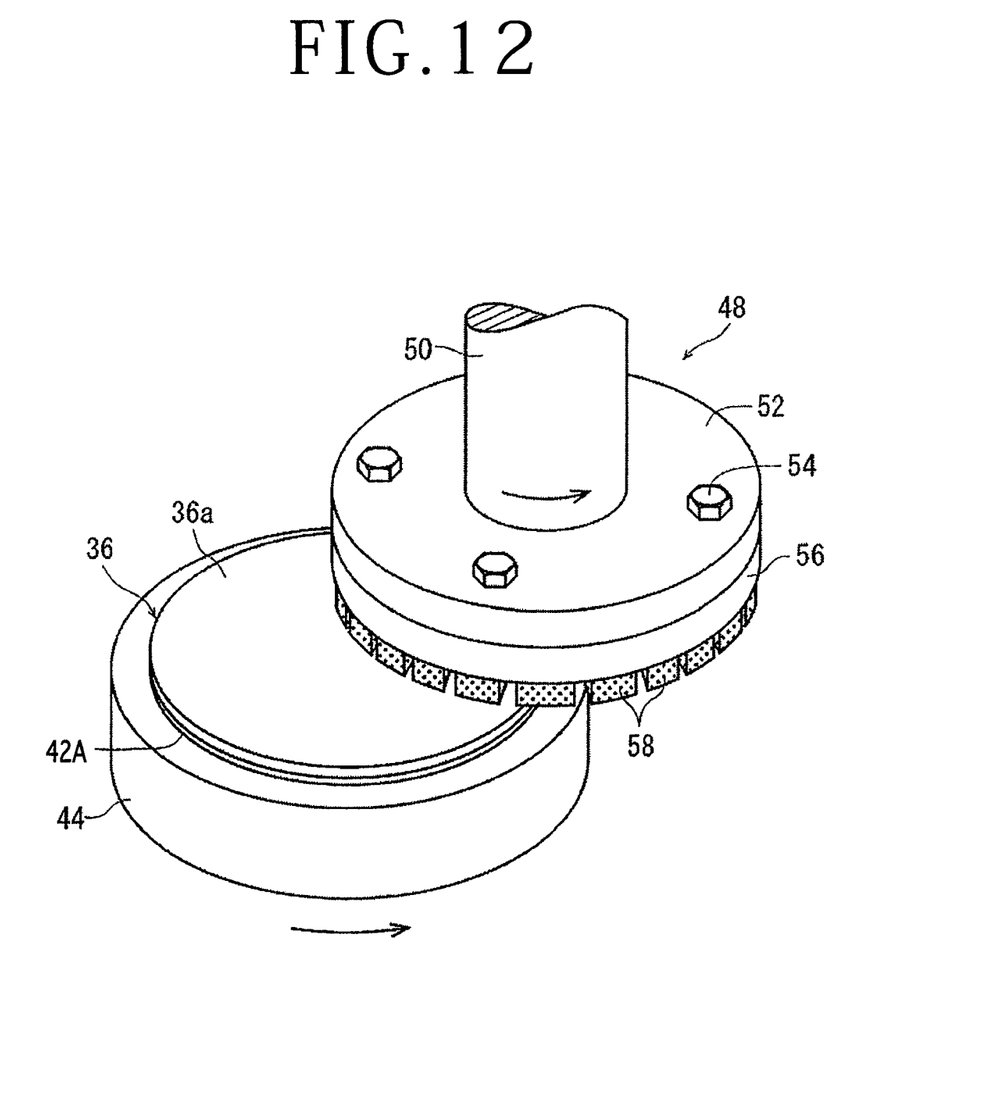
FIG. 12 is a perspective view depicting a first surface flattening step.

After performing the second surface supporting step, a first surface flattening step is performed to grind the first surface 36a of the wafer 36 supported on the chuck table 44 by using a grinding wheel, thereby flattening the first surface 36a. The first surface flattening step may be performed by using a grinding apparatus 48, a part of which is depicted in FIG. 12. The grinding apparatus 48 includes a spindle 50 extending in a vertical direction, a spindle motor (not depicted) connected to the upper end of the spindle 50 for rotating the spindle 50, and a disk-shaped wheel mount 52 fixed to the lower end of the spindle 50. An annular grinding wheel 56 is fixed to the lower surface of the wheel mount 52 by bolts 54. A plurality of abrasive members 58 are fixed to the lower surface of the grinding wheel 56 so as to be arranged annularly at given intervals along the outer circumference of the grinding wheel 56.

In the first surface flattening step, the chuck table 44 holding the wafer 36 is first moved from the standby position (not depicted) to the grinding position depicted in FIG. 12. Thereafter, the chuck table 44 is rotated at a predetermined speed (e.g., 300 rpm) in a counterclockwise direction as viewed in plan. Further, the spindle 50 is rotated at a predetermined speed (e.g., 6000 rpm) in a counterclockwise direction as viewed in plan. Thereafter, the spindle 50 is lowered by operating any elevating means (not depicted) included in the grinding apparatus 48 until the abrasive members 58 come into contact with the first surface 36a of the wafer 36. Thereafter, the spindle 50 is further lowered at a predetermined feed speed (e.g., 1.0 μm/s). Accordingly, the first surface 36a of the wafer 36 is ground by the abrasive members 58 to become a flat surface.

After performing the first surface flattening step, a resin layer peeling step is performed to peel the resin layer 42A from the wafer 36. After performing the resin layer peeling step, a first surface supporting step is performed to support the first surface 36a of the wafer 36 on the chuck table 44. After performing the first surface supporting step, a second surface flattening step is performed to grind the second surface 36b of the wafer 36 supported on the chuck table 44 by using the abrasive members 58, thereby flattening the second surface 36b. The first surface supporting step is performed similarly to the second surface supporting step depicted in FIG. 11 except that the resin layer 42A is removed and the second surface 36b is oriented upward. Further, the second surface flattening step is also performed similarly to the first surface flattening step depicted in FIG. 12 except that the resin layer 42A is removed and the second surface 36b is oriented upward.

According to the above preferred embodiment, the following effect can be exhibited. The wafer 36 is held on the holding surface 4a of the holding portion 4 in the condition where the undulation of the wafer 36 is followed by the undulation of the holding surface 4a. Accordingly, the undulation of the wafer 36 is maintained by the holding portion 4. As a result, even when the gel resin 42 is cured in the resin curing step, the wafer 36 is not distorted. Accordingly, by performing the wafer processing method using the wafer holding apparatus 2, the undulation of the wafer 36 can be properly removed by grinding the wafer 36.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer having a first surface and a second surface opposite to the first surface, the wafer processing method using a wafer holding apparatus including
   a holding portion having a holding surface for holding the wafer having undulation, the holding portion being composed of a plurality of length changing elements having suction holes selectively connected to a vacuum source, the length changing elements having front end surfaces collected to form the holding surface,
   a frame member supporting the holding portion, and
   a control unit controlling a length of each of the length changing elements according to the undulation of the wafer,
   the wafer processing method comprising:
   an undulation detecting step of detecting undulation of the first surface of the wafer;
   an undulation producing step of controlling the length of each of the length changing elements of the wafer holding apparatus according to the undulation of the wafer, thereby producing undulation on the holding surface;
   a holding step of holding the wafer on the holding surface in a condition where the undulation of the wafer is made to coincide with the undulation of the holding surface;
   a resin applying step of applying a gel resin to a substrate having a flat surface;
   a resin curing step of opposing the second surface of the wafer to the flat surface of the substrate, next pressing the gel resin applied to the flat surface of the substrate, next transferring the gel resin to the second surface of the wafer, and finally curing the gel resin to form a resin layer on the second surface of the wafer; and
   a separating step of separating the wafer with the resin layer from the substrate.

2. The wafer processing method according to claim 1, further comprising:
   a second surface supporting step of supporting the second surface of the wafer with the resin layer on a chuck table;
   a first surface flattening step of grinding the first surface of the wafer supported on the chuck table by using a grinding wheel, thereby flattening the first surface of the wafer;
   a resin layer peeling step of peeling the resin layer from the wafer after performing the first surface flattening step;
   a first surface supporting step of supporting the first surface of the wafer on the chuck table after performing the resin layer peeling step; and
   a second surface flattening step of grinding the second surface of the wafer supported on the chuck table by using the grinding wheel, thereby flattening the second surface of the wafer.

* * * * *